(12) United States Patent
Hay et al.

(10) Patent No.: US 8,301,932 B2
(45) Date of Patent: Oct. 30, 2012

(54) SYNCHRONISING BETWEEN CLOCK DOMAINS

(75) Inventors: Timothy Nicholas Hay, Cambridge (GB); Brett Stanley Feero, Cambridge (GB)

(73) Assignee: ARM Limited, Cambridge (GB)

( * ) Notice: Subject to any disclaimer, the term of this patent is extended or adjusted under 35 U.S.C. 154(b) by 386 days.

(21) Appl. No.: 12/591,315

(22) Filed: Nov. 16, 2009

(65) Prior Publication Data

US 2011/0116337 A1    May 19, 2011

(51) Int. Cl.
*G06F 1/12*    (2006.01)
(52) U.S. Cl. ....................................... 713/400
(58) Field of Classification Search ............. 713/400
See application file for complete search history.

(56) References Cited

U.S. PATENT DOCUMENTS

| | | | | |
|---|---|---|---|---|
| 5,684,982 A | * | 11/1997 | Gates | 713/400 |
| 5,822,571 A | * | 10/1998 | Goodrum et al. | 713/400 |
| 7,325,152 B2 | * | 1/2008 | Wallner et al. | 713/401 |
| 7,574,635 B1 | * | 8/2009 | Alfke | 714/719 |

OTHER PUBLICATIONS

J. Lee et al, "A Low-Power Implementation of Asynchronous 8051 Employing Adaptive Pipeline Structure" *IEEE Transactions on Circuits and Systems—II: Express Briefs*, vol. 55, No. 7, Jul. 2008, pp. 673-677.
A. Efthymiou et al, "Adaptive Pipeline Structures for Speculation Control".
C.E. Cummings, "Simulation and Synthesis Techniques for Asynchronous FIFO Design" Sunburst Design, 2002, pp. 1-23.

* cited by examiner

*Primary Examiner* — Paul R Myers
*Assistant Examiner* — Jeremy S Cerullo
(74) *Attorney, Agent, or Firm* — Nixon & Vanderhye P.C.

(57) ABSTRACT

An integrated circuit 2 is provided with multiple clock domains separated by a clock boundary 8. Data values are passed across the clock boundary 8 using a first-in-first-out memory (FIFO), a read pointer and a write pointer for the FIFO are passed across the clock boundary 8 and must be synchronized to the receiving clock frequency. The clocks being used on either side of the clock boundary 8 may be switched and have a variable relationship therebetween. Multiple synchronization paths are provided within pointer synchronizing circuitry 32 which are used depending upon the particular relationship between the clocks on either side of the clock boundary 8. A pre-switch pointer value is held in a transition register 44 until a post-switch pointer value is available from the new synchronizing path 36 when a switch in clock mode is made which requires an increase in synchronization delay.

21 Claims, 5 Drawing Sheets

SYNCHRONISING BETWEEN CLOCK DOMAINS

BACKGROUND OF THE INVENTION

1. Field of the Invention

This invention relates to the field of data processing systems. More particularly, this invention relates to the field of synchronising between clock domains within data processing systems.

2. Description of the Prior Art

It is known to provide data processing systems having multiple clock domains. As an example, one clock domain may operate at a high frequency to perform computationally intensive tasks while another clock domain operates at a lower clock frequency to perform less demanding tasks. In order that these two clock domains can communicate, it is necessary to provide synchronisation mechanisms for passing signals between the domains. One known way of doing this is to utilise a first-in-first-out memory (FIFO) between the two clock domains with data values being written into the FIFO from one clock domain and then read out of the FIFO from another clock domain. In order that the writing and reading operations can be appropriately controlled, and particularly to avoid overflow/underflow of the FIFO, it is necessary for the write pointer being used on the input side of the FIFO to be passed to the output side of the FIFO and similarly for the read pointer being used on the output side of the FIFO to be passed to the input side of the FIFO. The passage of these pointers across the clock domain boundary also requires that they be synchronised. In order to provide such synchronisation, it is known to provide a synchronisation path for the pointer signals utilising D-type latches to give glitch and meta-stability resistance at the price of increasing the latency with which a pointer can be passed across the boundary.

With the advent of more sophisticated clock control requirements, such as frequency scaling in which the clock frequencies being used can be adjusted over time to match the processing load, the nature of the synchronisation performed across a clock boundary will change with time. As an example, in one mode of a system both sides of the clock domain boundaries utilise the same clock which is synchronous across the clock boundary. In this circumstance no synchronisation is required. The system may also operate in a different mode in which the clock frequency on one side of the boundary is higher or lower than on the other side of the boundary and is asynchronous with the clock on the other side of the boundary. While it is possible to use synchronisation mechanisms which deal with these synchronisation challenges individually, it is difficult to switch between the use of these mechanisms.

One known way of switching between the synchronisation mechanism in use is to receive notification that a change of clocks requiring a change in synchronisation mechanism is required, drain all of the FIFO memories of any values that they are holding and then switch the synchronisation mechanism when there is no data in-flight. Such mechanisms may also require the master circuits transmitting data to be notified to stop transmitting further data until the change has been made. Such a change can take many hundreds of processing cycles to perform and this is a significant disadvantage.

SUMMARY OF THE INVENTION

Viewed from one aspect the present invention provides apparatus for processing data comprising:

first circuitry within a first clock domain and operating in synchronism with a first clock signal;

second circuitry within a second clock domain and operating in synchronism with a second clock signal, said second clock signal being at least one of asynchronous with said first clock signal and having a different frequency from said first clock signal in at least one mode of operation of said apparatus;

a first-in-first-out memory circuitry having an input coupled to said first circuitry and an output coupled to said second circuitry and configured to pass a data value from said first circuitry to said second circuitry; wherein said first-in-first-out memory circuitry includes write pointer circuitry within said first clock domain and configured to store a write pointer value indicative of a write position within said first-in-first-out memory circuitry to which a next input data value received from said first circuitry will be written;

said first-in-first-out memory circuitry includes read pointer circuitry within said second clock domain and configured to store a read pointer value indicative of a read position within said first-in-first-out memory circuitry from which a next output data value to be output to said second circuitry will be read;

said first-in-first-out memory circuitry includes at least one pointer synchronising circuit configured to pass a pointer being one of said write pointer and said read pointer between a portion of said first-in-first-out memory circuitry within said first domain and a portion of said first-in-first-out memory circuitry within said second domain, said at least one pointer synchronising circuit having:

(i) a plurality of synchronising paths with respective different synchronising delays, a synchronising path being selected for use from said plurality of synchronising paths in dependence upon a relationship between said first clock signal and said second clock; and (ii) a transition register configured to hold for output, upon at least one change in synchronising path from a first synchronising path to a second synchronising path that increases synchronising delay, a pre-switch value of said pointer output from said first synchronising path until a post-switch value of said pointer synchronised by passage through said second synchronising path is available for output.

The invention recognises that it is possible to dynamically change the synchronisation mechanism in use by changing the synchronisation path being used by one or more FIFO pointers if the FIFO is modified so as to hold the pre-switch value of the pointer until after the post-switch value of that pointer correctly synchronised with the new synchronisation path is available for output. The flow control mechanisms on each side of the FIFO can continue to operate during this transition and accordingly data can continue to flow into and out of the FIFO memory during the switch. The significantly reduced latency associated with making such a switch has the result that more fine-grained control of the clock modes becomes practical and it is possible to switch to the most appropriate clock more rapidly, such as switching to a slower clock for only a few clock cycles since it is possible to switch back to the faster clock signal with little latency if this is required. Depending upon the clock modes supported on each side of the clock domain boundary, it may be necessary to provide this mechanism for holding the pointer output value in respect of either one or both of the read pointer or the write pointer to the FIFO.

The clocking modes supported on either side of the clock domain boundary can also vary. As examples, it is possible that the clocks on either side of the boundary could be synchronous and have the same frequency, in which case the synchronisation path can be a straight through path.

Another possibility is that the clocks on either side of the boundary are asynchronous, in which case the synchronisation path should include at least two serially connected latches through which the pointer is clocked and having a synchronising delay of at least two clock cycles of the pointer receiving clock domain so as to ensure appropriate glitch and meta-stability resistance in reception of the pointer across the clock domain boundary.

In other embodiments it is possible that the read side of the FIFO is clocked with a frequency which is an integer multiple of the write side clock frequency. In this case the read pointer being passed back to the write side can be synchronised with a one latch delay. In an analogous way, it is possible that the write side of the clock domain boundary may have a clock frequency which is an integer multiple of the clock frequency on the read side. In this case, the write pointer being passed to the read side can be synchronised with a one latch delay.

A further possibility is that both the read side clock and the write side clock are derived from a different clock having a higher frequency and accordingly are synchronous with an M:N relationship between their frequencies in which case both the write pointer and the read pointer can be synchronised as they are passed across the clock boundary using a one latch delay in the synchronisation path.

The selection of which synchronisation path is to be used by the pointer synchronising circuit can be programmable, e.g. set under software control when software is also changing the clock frequencies or set under control of a state machine which is controlling the clock changes.

Whilst it is possible that the different clock domains could be formed on different integrated circuits, the technique is well suited to use when both clock domains are formed on the same integrated circuit.

The mechanism of using FIFO memories at clock boundaries is well suited to systems using interconnect circuitry to connect different portions of an overall system, such as a system-on-chip integrated circuit, when the FIFO can be provided as part of the interconnect circuitry.

In order to improve glitch and meta-stability resistance in the pointer values passed across the clock domain boundary, these may be Graycoded.

The data values being passed across the clock domain boundary via the FIFO can take a variety of forms and may be single-bit values. However, the use of FIFO memories is well suited to systems in which multi-bit values are passed across the clock domain boundaries.

The latches used within the synchronising paths may take a wide variety of different forms. However, one form of latch well suited to this purpose is a D-type latch.

The transition register used to hold the pre-switch pointer value during the change of synchronisation path may be advantageously provided by reuse of a latch which is included in another synchronising path not taking part in the switch being performed. This reduces the hardware overhead of the present technique.

Control of the transition register may be conveniently performed by a control delay path formed of serially connected latches matching the serially connected latches forming one of the plurality of synchronising paths. The synchronising path which is matched may be the longest synchronising path and typically the one which when switched into use produces an increase in synchronisation delay. Accordingly, forming the control delay path matched to this longest synchronising delay has the result that if, depending upon the process or implementation being used, the longest synchronising delay is altered, then the control delay path may readily be altered in the same way in order that correct operation of the circuit be maintained.

Viewed from another aspect the present invention provides an apparatus for processing data comprising:

first circuit means within a first clock domain and operating in synchronism with a first clock signal;

second circuit means within a second clock domain and operating in synchronism with a second clock signal, said second clock signal being at least one of asynchronous with said first clock signal and having a different frequency from said first clock signal in at least one mode of operation of said apparatus;

first-in-first-out memory means having an input coupled to said first circuit means and an output coupled to said second circuit means for passing a data value from said first circuit means to said second circuit means; wherein said first-in-first-out memory means includes write pointer means within said first clock domain for storing a write pointer value indicative of a write position within said first-in-first-out memory means to which a next input data value received from said first circuit means will be written;

said first-in-first-out memory means includes read pointer means within said second clock domain for storing a read pointer value indicative of a read position within said first-in-first-out memory means from which a next output data value to be output to said second circuit means will be read;

said first-in-first-out memory means includes at least one pointer synchronising means for passing a pointer being one of said write pointer and said read pointer between a portion of said first-in-first-out memory means within said first domain and a portion of said first-in-first-out memory means within said second domain, said at least one pointer synchronising means having:

(i) a plurality of synchronising paths with respective different synchronising delays, a synchronising path being selected for use from said plurality of synchronising paths in dependence upon a relationship between said first clock signal and said second clock; and (ii) a transition register means for holding for output, upon at least one change in synchronising path from a first synchronising path to a second synchronising path that increases synchronising delay, a pre-switch value of said pointer output from said first synchronising path until a post-switch value of said pointer synchronised by passage through said second synchronising path is available for output.

Viewed from a further aspect the present invention provides a method of processing data comprising the steps of:

operating first circuitry within a first clock domain in synchronism with a first clock signal;

operating second circuitry within a second clock domain in synchronism with a second clock signal, said second clock signal being at least one of asynchronous with said first clock signal and having a different frequency from said first clock signal in at least one mode of operation of said apparatus;

passing a data value from said first circuitry to said second circuitry with a first-in-first-out memory circuitry having an input coupled to said first circuitry and an output coupled to said second circuitry; wherein storing a write pointer value in write pointer circuitry within said first-in-first-out memory circuitry and said first clock domain, said write pointer value being indicative of a write position within said first-in-first-out memory circuitry to which a next input data value received from said first circuitry will be written;

storing a read pointer value in read pointer circuitry within said first-in-first-out memory circuitry and said second clock domain, said read pointer value being indicative of a read position within said first-in-first-out memory circuitry from which a next output data value to be output to said second circuitry will be read;

passing with at least one pointer synchronising circuit within said first-in-first-out memory circuitry a pointer being one of said write pointer and said read pointer between a portion of said first-in-first-out memory circuitry within said first domain and a portion of said first-in-first-out memory circuitry within said second domain, said at least one pointer synchronising using:

(i) a plurality of synchronising paths with respective different synchronising delays, a synchronising path being selected for use from said plurality of synchronising paths in dependence upon a relationship between said first clock signal and said second clock; and (ii) a transition register configured to hold for output, upon at least one change in synchronising path from a first synchronising path to a second synchronising path that increases synchronising delay, a pre-switch value of said pointer output from said first synchronising path until a post-switch value of said pointer synchronised by passage through said second synchronising path is available for output.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
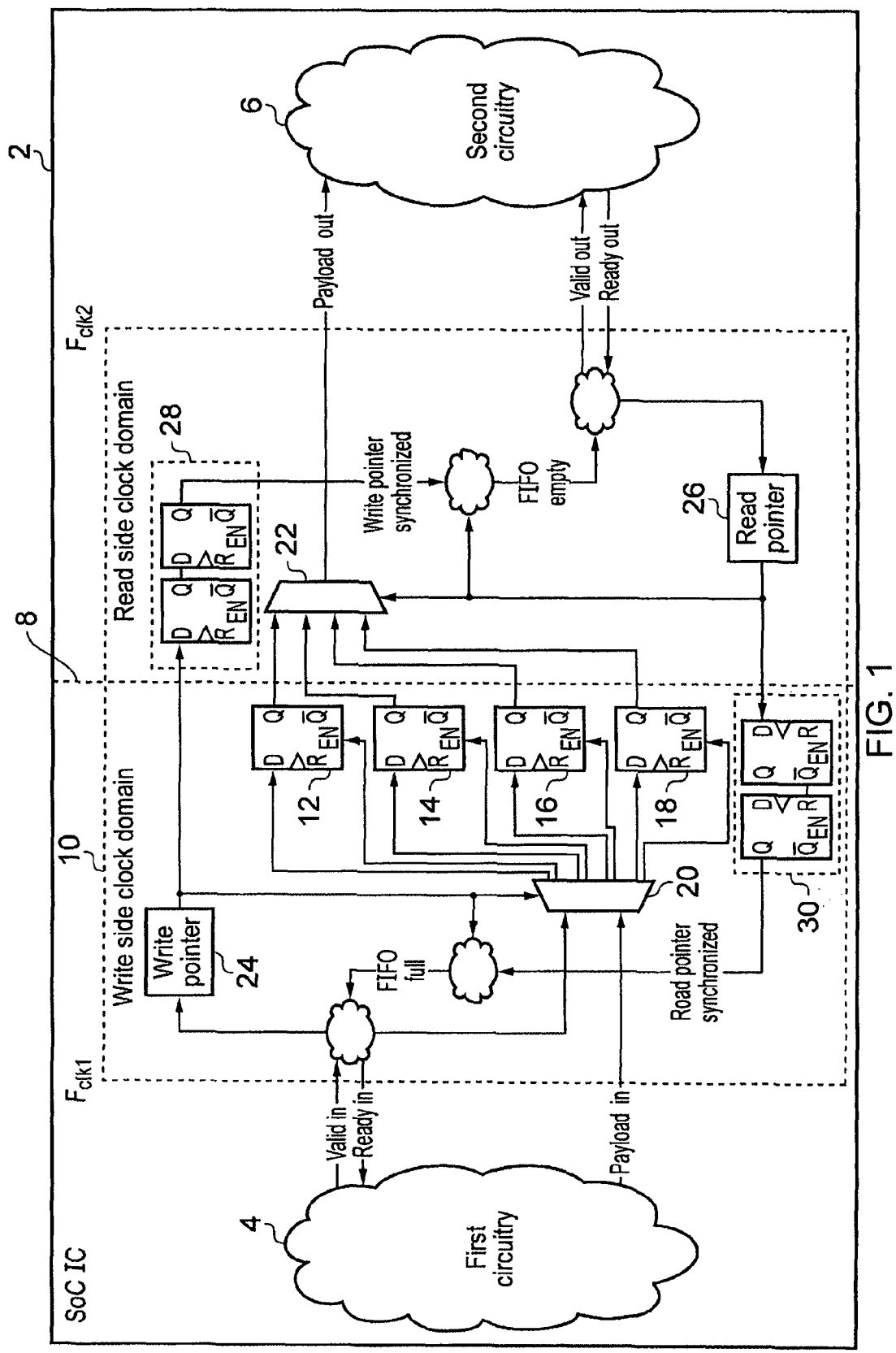
FIG. 1 schematically illustrates a system-on-chip integrated circuit including multiple clock domains with a FIFO being used to pass a data value across a clock domain boundary.

FIG. 1 illustrates a system-on-chip integrated circuit 2 including first circuitry 4 located within a first clock domain and second circuitry 6 located within a second clock domain. In this example embodiment the first circuitry 4 is arranged to pass a data value (payload) across a clock boundary 8 to the second circuitry 6. Accordingly, the first circuitry 4 is on the write side and the second circuitry 6 is on the read side of a first-in-first-out memory (FIFO) 10. This FIFO 10 has four memory slots 12, 14, 16, 18 which are written to by the first circuitry via a de-multiplexer 20. On the read side, the second circuitry 6 reads these memory slots 12, 14, 16, 18 via a multiplexer 22. A write pointer controls the selection made by the de-multiplexer 20 of the next memory slot 12, 14, 16, 18 to be written to and a read pointer controls the multiplexer 22 to point to the next memory slot 12, 14, 16, 18 from which a data value is to be read. The write pointer is stored within the write pointer circuitry 24 and is passed across the clock boundary 8 in order that it can be ensured that the read pointer does not try and read a memory slot 12, 14, 16, 18 which has not yet been written. In a similar way, the read pointer generated by the read pointer circuitry 26 is passed across the clock boundary 8 in order that it may be ensured that the first circuitry 4 does not write to a memory slot 12, 14, 16, 18 which is currently storing a data value which has not yet been read by the second circuitry 6.

As the write pointer and the read pointer cross the clock boundary 8, they pass through pointer synchronising circuitry 28, 30 located within the side of the boundary at which they are being received. This pointer synchronising circuitry 28, 30 is schematically illustrated in FIG. 1 as containing two D-type latches. Such an arrangement may be appropriate in some circumstances, but it will be appreciated that the particular form of pointer synchronisation circuitry will depend upon the relative frequencies and synchronisations of the clock signals on either side of the clock boundary 8.

Figure 2:
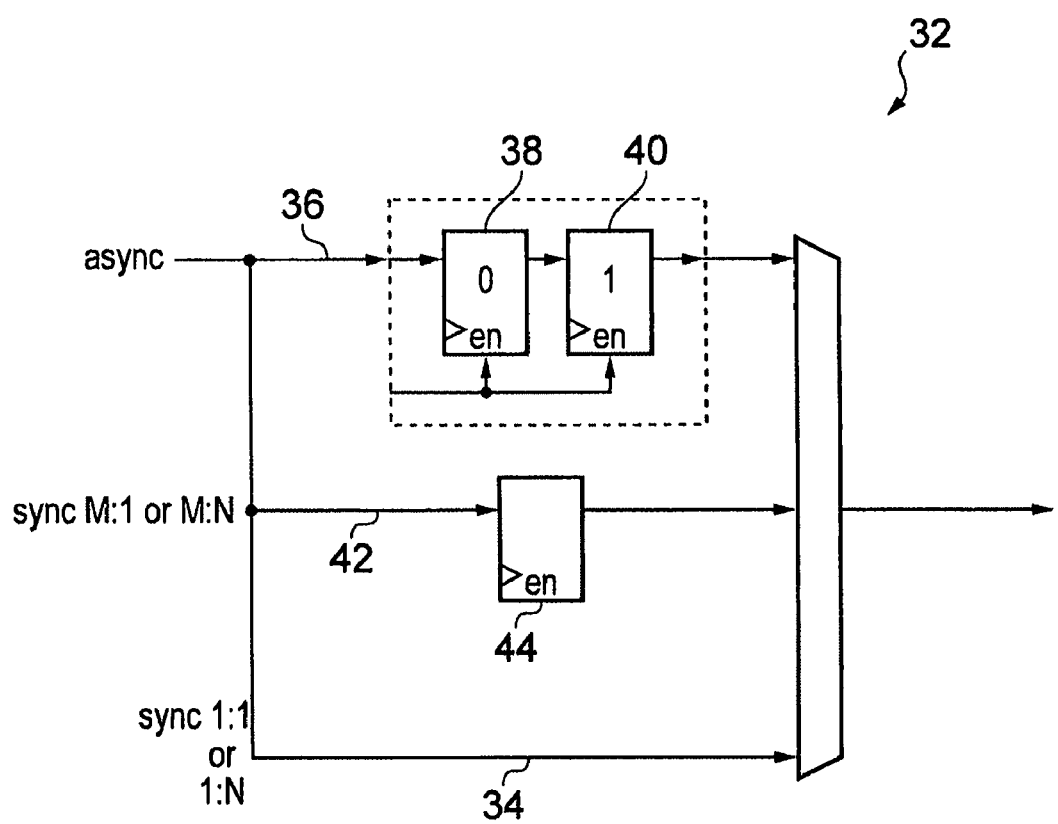
FIG. 2 schematically illustrates multiple synchronisation paths which may be used for a FIFO pointer passed across a clock boundary.

FIG. 2 schematically illustrates a plurality of synchronising paths 32 which may be used within the pointer synchroniser circuitry 28, 30. In particular, in this example three synchronising paths are provided, namely a straight through path 34 for use when the clocks on both sides of the clock boundary 8 have the same frequency and are synchronous with one another or the destination clock is faster. An asynchronous path 36 is provided having at least two serially connected D-type latches 38, 40 for use when the clock signals on either side of the clock boundary 8 are asynchronous with one another. A third synchronising path 42 is provided including a single D-type latch 44 for use in a down-synchronising path when the source clock frequency is an integer multiple of the destination clock frequency and synchronous therewith. At 28 the source clock is the first clock and the destination clock is the second clock (and vice-versa at 30). This down-synchronising path may also be used when both the clock signals on either side of the clock boundary 8 are derived from a signal of a higher frequency (i.e. are synchronous) and have a ratio of M:N between their frequencies where M and N are both integers greater than one. The ratios vary depending upon whether FIG. 2 corresponds to the pointer synchroniser circuitry 30 or 28.

Figure 3:
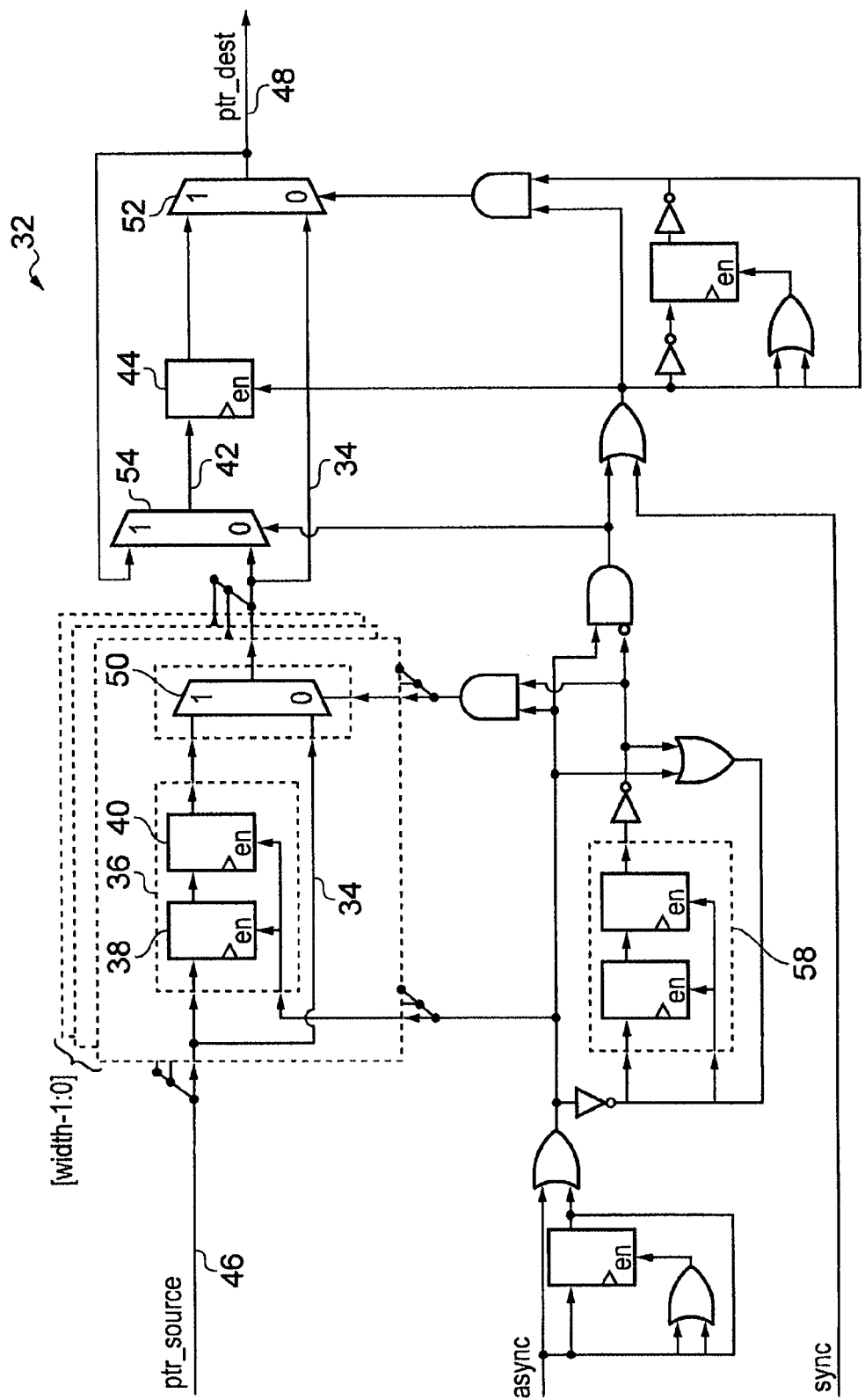
FIG. 3 illustrates in more detail an example pointer synchronisation circuit providing multiple synchronisation paths which may be dynamically switched into and out of use.

FIG. 3 schematically illustrates the pointer synchronising circuit 32 in more detail. This circuit can be used to pass pointer values in either direction across the clock boundary 8. In this example the pointer value to be passed across the clock boundary 8 is received at signal line 46. The pointer value appropriately synchronised to the clock signal on the other side of the clock boundary 8 is output on signal line 48. This pointer value may take one of a plurality of different paths through the pointer synchronising circuitry 32. These correspond to the straight through path 34 which routes via multiplexers 50, 52, an asynchronous path 36 which routes via the D-type latches 38, 40 and multiplexers 50 and 52, and the third synchronising path 42 which routes via the D-type latch 44 via multiplexers 50, 54 and 52. A control delay path 58 is formed with the same number of D-type latches as form the asynchronous path 36 and serves to control use of the D-type latch 44 which forms part of the third synchronising path 42 when this D-type latch 44 is reused as a transition register serving to hold the pre-switch pointer value as the output on signal line 48 until the post-switch pointer value which has been synchronised by passage through the asynchronous path 36 becomes available at the output of the D-type latch 40.

Figure 4:
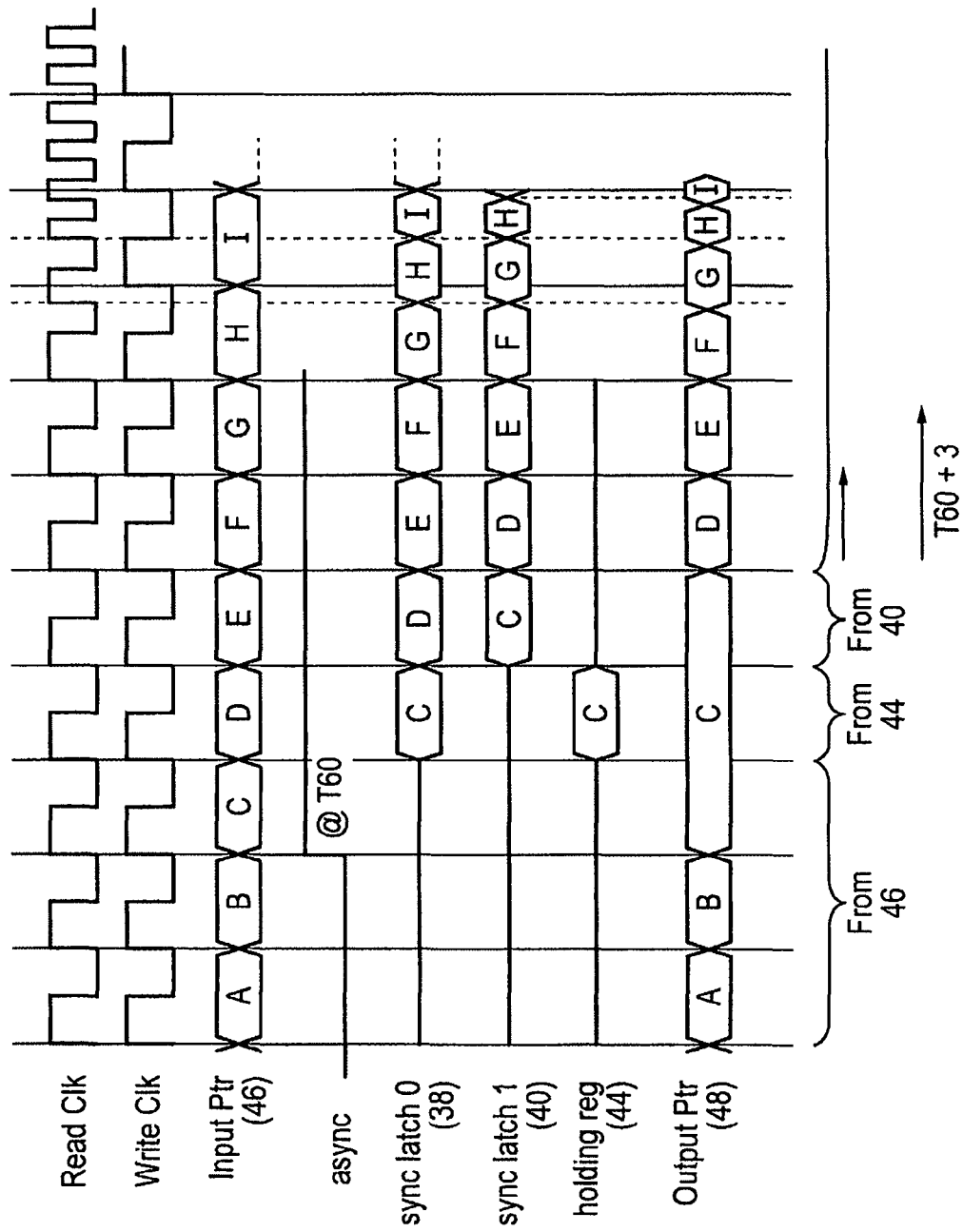
FIG. 4 is a signal timing diagram illustrating operation of the circuit of FIG. 3 when switching between clocks which are synchronous and clocks which are asynchronous.

FIG. 4 is a signal diagram schematically illustrating the relationship between values of the pointer value input to the pointer synchronising circuitry 32 and output from the pointer synchronising circuitry 32 over time together with the pointer values held within D-type latches 38 and 40. The example illustrated is a switch between the clocks on the destination side and the source side being synchronous and with the same frequency to the destination side clock being asynchronous with and having a higher frequency than the source side clock.

As is illustrated for the first two data beats A and B, the output pointer and the input pointer are the same and in synchronisation with one another with zero latency (substantially zero synchronisation delay) therebetween. At time 60, a programmable signal is issued (e.g. the "async" signal of FIG. 3) which indicates that a switch has been made between synchronous clocks and asynchronous clocks. This signal may be issued under program control as part of clock frequency control or by a state machine. At the next destination clk edge, the D-type latch 44 serves to capture and hold the pre-switch pointer value being output which in this case is pointer value C. The D-type latch 44 thus serves as a transition register. The D-type latches 38 and 40 also start to be clocked by the destination read side clock signal for two destination side clock periods. This clocks the input pointer value received on the signal line 46 into the D-type latch 38 at its capture edge and clocks this down to the serially connected D-type latch 40 on the subsequent capture edge. As illustrated, the pointer value C is still current as the synchronised pointer value and serves as the post-switch pointer value when the two clock periods of the destination side clock have expired and a change is made to derive the output pointer value on signal line 48 from the D-type latch 40 rather than from the transition register being provided by the D-type latch of the third synchronisation path 42. Once this is completed the destination and source clocks can both safely be changed as shown at T60+3

Figure 5:
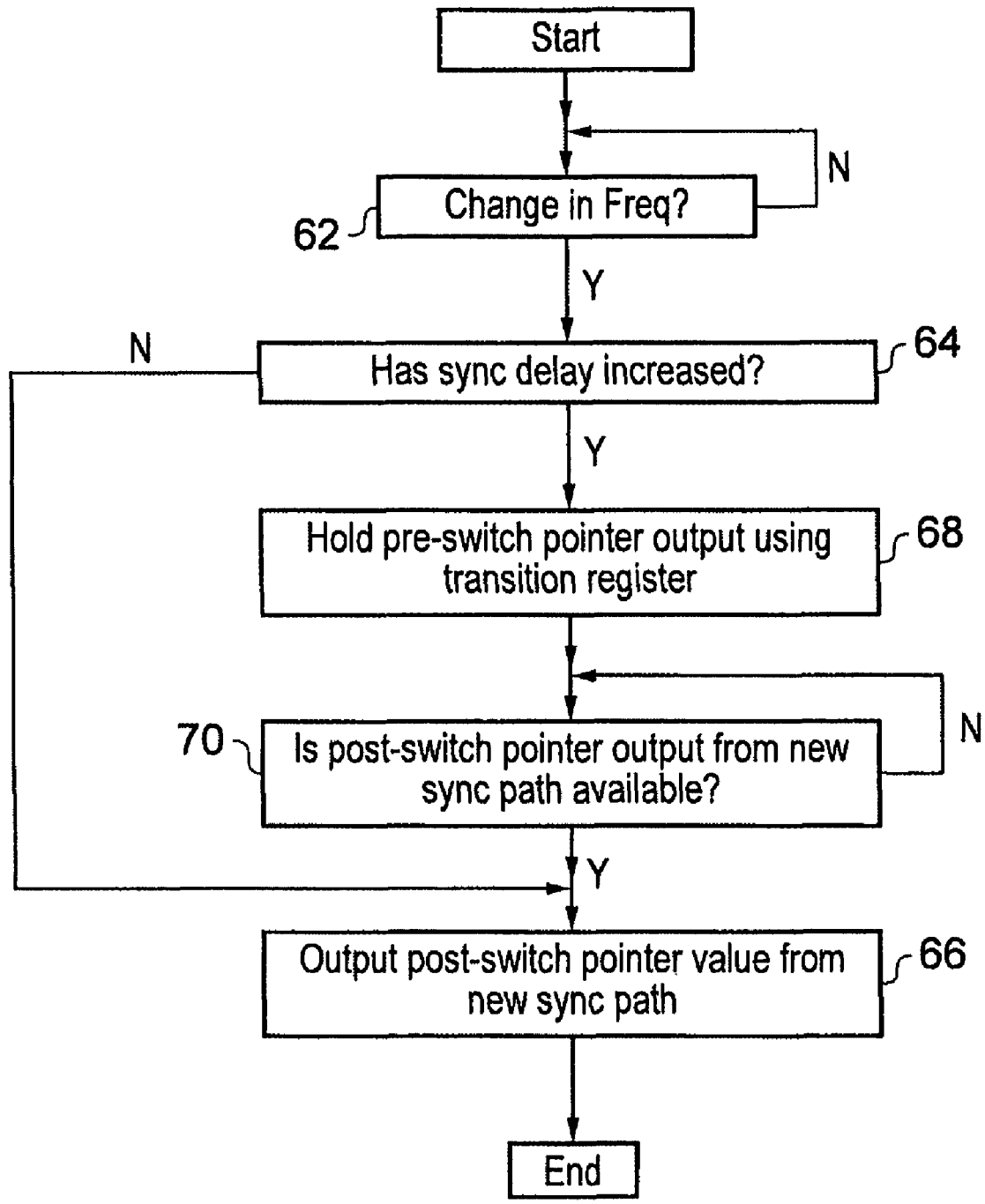
FIG. 5 is a flow diagram schematically illustrating a method of operation of the circuit of FIG. 3.

FIG. 5 schematically illustrates the operation of the pointer synchronising circuitry 32 of FIG. 3. At step 62 the process waits until a change in frequency between the two sides of the clock domain boundary 8 is detected. Step 64 then determines whether or not the synchronising delay required for the new relationship between the clock signals is an increased synchronising delay. If the synchronising delay is not increased, then processing proceeds directly to step 66 where the post-switch pointer value can be directly output since this will be available from the new synchronising path without an additional delay.

If the determination at step 64 was that the synchronising delay has increased, then processing proceeds to step 68 where the pre-switch pointer value is output from the transition register 44 on the output signal lines 48 until the post-switch pointer output appropriately synchronised via the new synchronisation path becomes available. Step 70 waits until the post-switch pointer output from the new synchronised path is available (e.g. if synchroniser depth is two, waits for two asynchronous clock periods on the receiving side) and then proceeds to step 66 where the post-switch pointer value can be output from the new synchronisation path.

Different systems can have differing requirements for synchroniser depth across asynchronous boundaries. This design therefore allows an easy change of the synchroniser to any depth. The circuit block 58 shown in FIG. 3 with the appropriate synchroniser is replaced in the same way as the synchroniser. Whether the depth of the synchroniser is two, three, or even more, this embodiment provides safe operation by storing the pre-switch value of the pointer in the transition register 44 until the post-switch pointer is available on the newly-selected synchronisation path.

The latency characteristics of read and write pointers may be as shown below:

Asynchronous:
  Read: equal to synchroniser depth
  Write: equal to synchroniser depth
1:N Synchronous (Read side has faster clock)
  Read: 1
  Write: 0
M:1 Synchronous (Write side has faster clock)
  Read: 0
  Write: 1
M:N Synchronous (Both sides are derived from a faster clock, neither is necessarily faster than the other, and the frequency ratios may be something like 3:2 or 4:5)
  Read: 1
  Write: 1
1:1 Synchronous: None
Usage Example A: 1:N to Asynchronous
1. Program the appropriate register indicating an asynchronous clock boundary
2. Wait for response indicating successful change
3. User is free to change clocks
Usage Example B: Asynchronous to 1:1 Synchronous
1. Change clock frequencies of both sides such that they are fully synchronous
2. Program the appropriate register indicating a fully synchronous clock boundary
3. Wait for response indicating successful change Data continues to pass through this FIFO while the synchronization mode is being modified (i.e. during steps 1, 2, 3 of both examples).

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for processing data comprising:
  first circuitry within a first clock domain and operating in synchronism with a first clock signal;
  second circuitry within a second clock domain and operating in synchronism with a second clock signal, said second clock signal, in at least one mode of operation of said apparatus, being at least one of (1) asynchronous with said first clock signal and (2) having a different frequency from said first clock signal;
  a first-in-first-out memory circuitry having an input coupled to said first circuitry and an output coupled to said second circuitry and configured to pass a data value from said first circuitry to said second circuitry; wherein
  said first-in-first-out memory circuitry includes write pointer circuitry within said first clock domain and configured to store a write pointer value indicative of a write position within said first-in-first-out memory circuitry to which a next input data value received from said first circuitry will be written;
  said first-in-first-out memory circuitry includes read pointer circuitry within said second clock domain and configured to store a read pointer value indicative of a read position within said first-in-first-out memory circuitry from which a next output data value to be output to said second circuitry will be read;
  said first-in-first-out memory circuitry includes at least one pointer synchronising circuit configured to pass a pointer being one of said write pointer and said read pointer between a portion of said first-in-first-out memory circuitry within said first domain and a portion of said first-in-first-out memory circuitry within said second domain, said at least one pointer synchronising circuit having:

(i) a plurality of synchronising paths with respective different synchronising delays, a synchronising path being selected for use from said plurality of synchronising paths in dependence upon a relationship between said first clock signal and said second clock; and (ii) a transition register configured to hold for output, upon at least one change in synchronising path from a first synchronising path to a second synchronising path that increases synchronising delay, a pre-switch value of said pointer output from said first synchronising path until a post-switch value of said pointer synchronized by passage through said second synchronising path is available for output.

2. Apparatus as claimed in claim 1, wherein said at least one pointer synchronising circuit includes a read pointer synchronising circuit within said first clock domain and passing said read pointer from said second clock domain to said first clock domain.

3. Apparatus as claimed in claim 1, wherein said at least one pointer synchronising circuit includes a write pointer synchronising circuit within said second clock domain and passing said write pointer from said first clock domain to said second clock domain.

4. Apparatus as claimed in claim 1, wherein said plurality of synchronising paths include a straight through path with substantially no synchronising delay through which said pointer is passed, said straight through path being selected when said first clock signal and said second clock signal are synchronous and have the same frequency.

5. Apparatus as claimed in claim 1, wherein said plurality of synchronising paths include an asynchronous path having at least two serially connected latches through which said pointer is clocked and a synchronising delay of at least two clock cycles of a pointer receiving clock domain being one of said first clock domain and said second clock domain, said asynchronous path being selected when said first clock signal and said second clock signal are asynchronous.

6. Apparatus as claimed in claim 2, wherein said plurality of synchronising paths within said read pointer synchronising circuit include an up-synchronising path having a latch through which said read pointer is clocked and a synchronising delay of one clock cycle of said first clock signal, said up-synchronising path being selected when said first clock signal and said second clock signal are synchronous and said second clock signal has a second clock frequency that is an integer multiple of a first clock frequency of said first clock signal.

7. Apparatus as claimed in claim 6, wherein said write pointer is passed from said first clock domain to said second clock domain using a straight through synchronising path with substantially no delay.

8. Apparatus as claimed in claim 2, wherein said plurality of synchronising paths within said read pointer synchronising circuit include a ratio synchronising path having a latch through which said read pointer is clocked and a synchronising delay of one clock cycle of said first clock signal, said ratio synchronising path being selected when said first clock signal and said second clock signal are synchronous and said second clock signal with a second clock frequency $f_{clk2}$ and said first clock signal frequency with a first clock frequency $f_{clk1}$ are such that $M*f_{clk2}$ is equal to $N*f_{clk1}$ when M and N are both integers greater than one and M does not equal N.

9. Apparatus as claimed in claim 3, wherein said plurality of synchronising paths within said write pointer synchronising circuit include a down-synchronising path having a latch through which said write pointer is clocked and a synchronising delay of one clock cycle of said second clock signal, said down-synchronising path being selected when said first clock signal and said second clock signal are synchronous and said first clock signal has a first clock frequency that is an integer multiple of a second clock frequency of said second clock signal.

10. Apparatus as claimed in claim 9, wherein said read pointer is passed from said second clock domain to said first clock domain using a straight through synchronising path with substantially no delay.

11. Apparatus as claimed in claim 3, wherein said plurality of synchronising paths within said write pointer synchronising circuit include a ratio synchronising path having a latch through which said write pointer is clocked and a synchronising delay of one clock cycle of said second clock signal, said ratio synchronising path being selected when said first clock signal and said second clock signal are synchronous and said second clock signal with a second clock frequency $f_{clk2}$ and said first clock signal frequency with a first clock frequency $f_{clk1}$ are such that $M*f_{clk2}$ is equal to $N*f_{clk1}$ when M and N are both integers greater than one and M does not equal N.

12. Apparatus as claimed in claim 1, wherein selection of which of said plurality of synchronising path is controlled by a programmable signal.

13. Apparatus as claimed in claim 1, wherein said apparatus is an integrated circuit with said first clock domain and said second clock domain being formed on different portions of said integrated circuit.

14. Apparatus as claimed in claim 13, wherein said first-in-first-out memory is part of interconnect circuitry between said first clock domain and said second clock domain.

15. Apparatus as claimed in claim 1, wherein said pointer is Gray coded.

16. Apparatus as claimed in claim 1, wherein said data value passed through said first-in-first-out memory is a multi-bit data value.

17. Apparatus as claimed in claim 1, wherein at least some of said plurality of synchronising paths include one or more D-type latches.

18. Apparatus as claimed in claim 1, wherein a third synchronization path separate from said first synchronising path and said second synchronising path includes a latch reused as said transition register.

19. Apparatus as claimed in claim 1, wherein holding for output of said pre-switch value by said transition register is controlled by a control delay path formed of serially connected latches matching serially connected latches forming one of said plurality of synchronising paths.

20. Apparatus for processing data comprising:
first circuit means within a first clock domain for operating in synchronism with a first clock signal;
second circuit means within a second clock domain for operating in synchronism with a second clock signal, said second clock signal, in at least one mode of operation of said apparatus, is at least one of (1) asynchronous with said first clock signal and (2) having a different frequency from said first clock signal;
first-in-first-out memory means, having an input coupled to said first circuit means and an output coupled to said second circuit means, for passing a data value from said first circuit means to said second circuit means; wherein said first-in-first-out memory means includes write pointer means, within said first clock domain, for storing a write pointer value indicative of a write position, within said first-in-first-out memory means, to which a next input data value received from said first circuit means will be written;

said first-in-first-out memory means includes read pointer means, within said second clock domain, for storing a read pointer value indicative of a read position, within said first-in-first-out memory means, from which a next output data value to be output to said second circuit means will be read;

said first-in-first-out memory means includes at least one pointer synchronising means for passing a pointer being one of said write pointer and said read pointer between a portion of said first-in-first-out memory means within said first domain and a portion of said first-in-first-out memory means within said second domain, said at least one pointer synchronising means having:

(i) a plurality of synchronising paths with respective different synchronising delays, a synchronising path being selected for use from said plurality of synchronising paths in dependence upon a relationship between said first clock signal and said second clock; and (ii) a transition register means for holding for output, upon at least one change in synchronising path from a first synchronising path to a second synchronising path that increases synchronising delay, a pre-switch value of said pointer output from said first synchronising path until a post-switch value of said pointer synchronized by passage through said second synchronising path is available for output.

21. A method of processing data comprising the steps of:

operating first circuitry within a first clock domain in synchronism with a first clock signal;

operating second circuitry within a second clock domain in synchronism with a second clock signal, said second clock signal, in at least one mode of operation of said apparatus, being at least one of (1) asynchronous with said first clock signal and (2) having a different frequency from said first clock signal;

passing a data value from said first circuitry to said second circuitry with a first-in-first-out memory circuitry having an input coupled to said first circuitry and an output coupled to said second circuitry; wherein storing a write pointer value in write pointer circuitry within said first-in-first-out memory circuitry and said first clock domain, said write pointer value being indicative of a write position within said first-in-first-out memory circuitry to which a next input data value received from said first circuitry will be written;

storing a read pointer value in read pointer circuitry within said first-in-first-out memory circuitry and said second clock domain, said read pointer value being indicative of a read position within said first-in-first-out memory circuitry from which a next output data value to be output to said second circuitry will be read;

passing with at least one pointer synchronising circuit within said first-in-first-out memory circuitry a pointer being one of said write pointer and said read pointer between a portion of said first-in-first-out memory circuitry within said first domain and a portion of said first-in-first-out memory circuitry within said second domain, said at least one pointer synchronising using:

(i) a plurality of synchronising paths with respective different synchronising delays, a synchronising path being selected for use from said plurality of synchronising paths in dependence upon a relationship between said first clock signal and said second clock; and (ii) a transition register configured to hold for output, upon at least one change in synchronising path from a first synchronising path to a second synchronising path that increases synchronising delay, a pre-switch value of said pointer output from said first synchronising path until a post-switch value of said pointer synchronized by passage through said second synchronising path is available for output.

* * * * *